United States Patent
Chu et al.

(10) Patent No.: US 10,381,338 B2
(45) Date of Patent: Aug. 13, 2019

(54) METAL FILL OPTIMIZATION FOR SELF-ALIGNED DOUBLE PATTERNING

(71) Applicant: INTERNATIONAL BUSINESS MACHINES CORPORATION, Armonk, NY (US)

(72) Inventors: Albert M. Chu, Nashua, NH (US); Lawrence A. Clevenger, Lagrangeville, NY (US); Ximeng Guan, Fremont, CA (US); Myung-Hee Na, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 106 days.

(21) Appl. No.: 15/604,090

(22) Filed: May 24, 2017

(65) Prior Publication Data

US 2018/0082854 A1  Mar. 22, 2018

Related U.S. Application Data

(63) Continuation of application No. 15/273,092, filed on Sep. 22, 2016, now Pat. No. 9,735,029.

(51) Int. Cl.
*H01L 27/02* (2006.01)
*H01L 23/522* (2006.01)

(52) U.S. Cl.
CPC ........ *H01L 27/0207* (2013.01); *H01L 23/522* (2013.01); *H01L 23/5222* (2013.01)

(58) Field of Classification Search
USPC .......................................................... 716/54
See application file for complete search history.

(56) References Cited

U.S. PATENT DOCUMENTS

| 9,735,029 B1 | 8/2017 | Chu et al. | |
|---|---|---|---|
| 2002/0074672 A1* | 6/2002 | Huang | H01L 21/4832 257/788 |
| 2007/0288879 A1* | 12/2007 | Kobayashi | G06F 17/5072 716/54 |
| 2014/0282344 A1* | 9/2014 | Hsu | G06F 17/5072 716/123 |

OTHER PUBLICATIONS

List of IBM Patents or Patent Applications Treated as Related; (Appendix P), Filed Jan. 5, 2018; pp. 1-2.

* cited by examiner

*Primary Examiner* — Bryce M Aisaka
(74) *Attorney, Agent, or Firm* — Cantor Colburn LLP; Vazken Alexanian

(57) ABSTRACT

A technique relates to a method of optimizing self-aligned double patterning. Predefined locations for required metal cuts are provided in order to form metal wires from metal fills that have been cut. Extended locations for extended metal cuts are provided in order to cut adjacent metal fills. The adjacent metal fills are the metal fills that are adjacent to the predefined locations for the required metal cuts, and the extended metal cuts extend beyond the required metal cuts. The required metal cuts into the metal fills are performed and the extended metal cuts into the adjacent metal fills are performed.

20 Claims, 12 Drawing Sheets

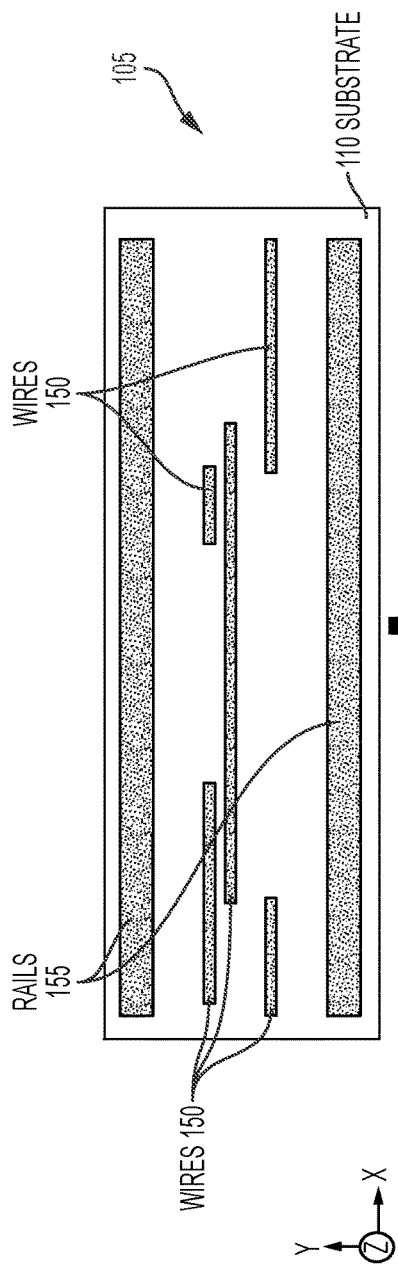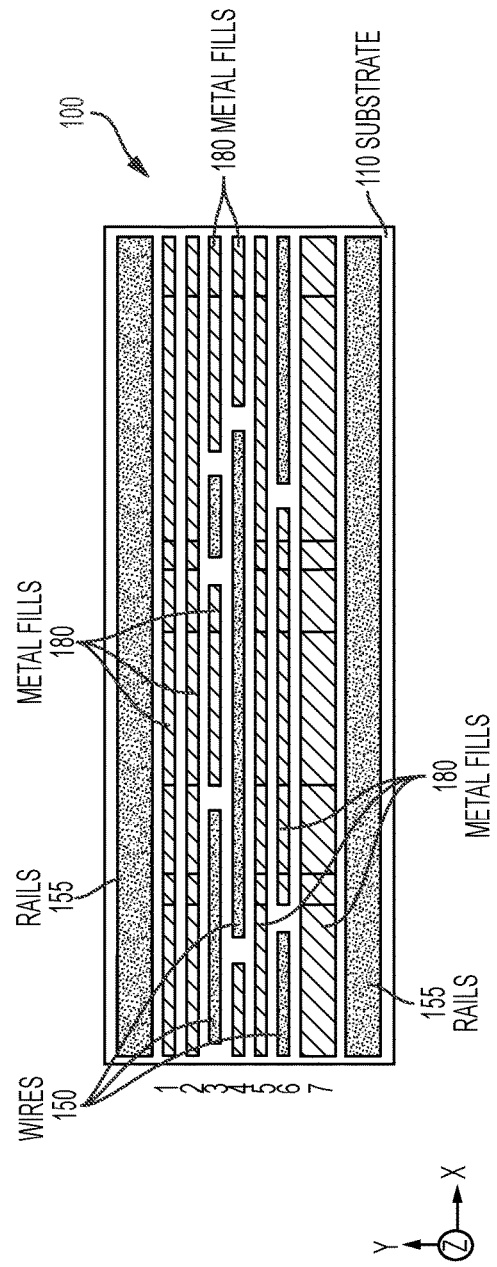

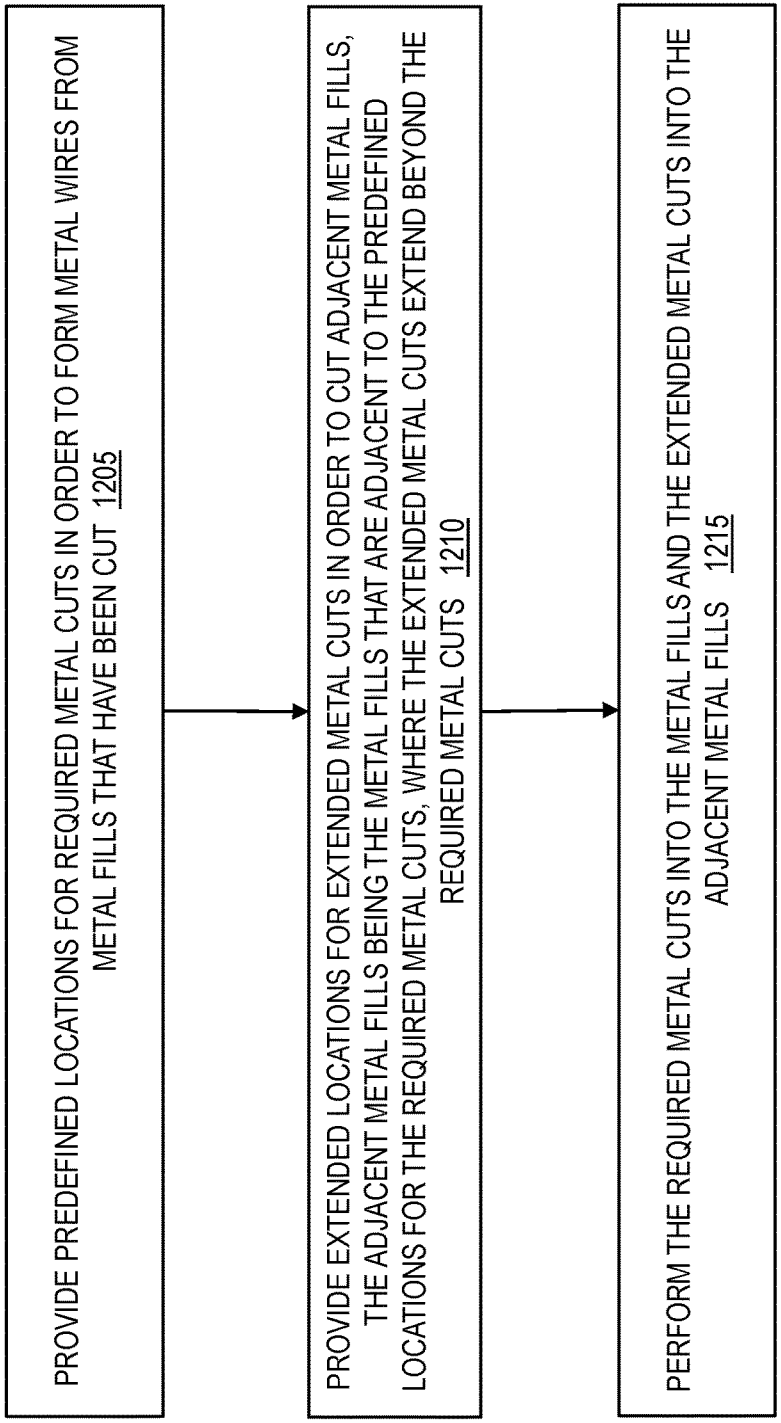

```
┌─────────────────────────────────────────────────────────────┐
│ PROVIDE PREDEFINED LOCATIONS FOR REQUIRED METAL CUTS IN     │
│ ORDER TO FORM METAL WIRES FROM METAL FILLS THAT HAVE BEEN   │
│ CUT  1305                                                   │
└─────────────────────────────────────────────────────────────┘
                              │
                              ▼
┌─────────────────────────────────────────────────────────────┐
│ PRIORITIZE THE METAL WIRES, SUCH THAT A HIGHEST PRIORITY    │
│ TO A LOWEST PRIORITY IS DETERMINED FOR THE METAL WIRES 1310 │
└─────────────────────────────────────────────────────────────┘
                              │
                              ▼
┌─────────────────────────────────────────────────────────────┐
│ EXPAND THE PREDEFINED LOCATIONS FOR THE REQUIRED METAL      │
│ CUTS TO HAVE EXTENDED LOCATIONS FOR EXTENDED METAL CUTS     │
│ IN ORDER TO CUT ADJACENT METAL FILLS, THE ADJACENT METAL    │
│ FILLS BEING THE METAL FILLS THAT ARE ADJACENT TO THE        │
│ PREDEFINED LOCATIONS FOR THE REQUIRED METAL CUTS, WHERE     │
│ THE EXTENDED METAL CUTS EXTEND BEYOND THE REQUIRED METAL    │
│ CUTS, WHERE THE METAL WIRES HAVING BEEN PRIORITIZED FROM    │
│ THE HIGHEST PRIORITY TO THE LOWEST PRIORITY ARE ASSOCIATED  │
│ WITH THE EXTENDED LOCATIONS FOR THE EXTENDED METAL CUTS     │
│ BECAUSE THE EXTENDED LOCATIONS ARE EXPANDED FROM THE        │
│ PREDEFINED LOCATIONS  1315                                  │
└─────────────────────────────────────────────────────────────┘
                              │
                              ▼
┌─────────────────────────────────────────────────────────────┐
│ PERFORM A CHECK ON THE EXTENDED LOCATIONS FOR THE EXTENDED  │
│ METAL CUTS IN AN ORDER OF THE HIGHEST PRIORITY TO THE       │
│ LOWEST PRIORITY OF THE EXTENDED METAL CUTS ASSOCIATED WITH  │
│ THE EXTENDED LOCATIONS, SUCH THAT A PROBABILITY OF HAVING   │
│ TO REMOVE THE EXTENDED LOCATIONS ASSOCIATED WITH METAL      │
│ WIRES HAVING A HIGHER PRIORITY IS SMALLER THAN HAVING TO    │
│ REMOVE THE EXTENDED LOCATIONS ASSOCIATED WITH METAL WIRES   │
│ HAVING A LOWER PRIORITY  1320                               │
└─────────────────────────────────────────────────────────────┘
                              │
                              ▼
┌─────────────────────────────────────────────────────────────┐
│ PERFORM THE REQUIRED METAL CUTS INTO THE METAL FILLS AND    │
│ THE EXTENDED METAL CUTS INTO THE ADJACENT METAL FILLS 1325  │
└─────────────────────────────────────────────────────────────┘
```

METAL FILL OPTIMIZATION FOR SELF-ALIGNED DOUBLE PATTERNING

DOMESTIC PRIORITY

This application is a continuation of U.S. Non-Provisional application Ser. No. 15/273,092, entitled "METAL FILL OPTIMIZATION FOR SELF-ALIGNED DOUBLE PATTERNING", filed Sep. 22, 2016, the contents of which is incorporated herein by reference in its entirety.

BACKGROUND

The present invention relates to self-aligned double patterning (SADP), and more specifically, to metal fill optimization for SADP.

The back-end-of-line (BEOL) is the second portion of integrated circuit fabrication where the individual devices (transistors, capacitors, resistors, etc.) are interconnected with wiring on the wafer, i.e., the metallization layer. Common metals that are used to form the metallization layers and interconnects are copper and aluminum. BEOL generally begins when the first layer of metal is deposited on the wafer. BEOL includes contacts, insulating layers (dielectrics), metal levels, and bonding sites for chip-to-package connections. The SADP process is typically part of the BEOL process.

SUMMARY

According to one or more embodiments, a method of optimizing self-aligned double patterning is provided. The method includes providing predefined locations for required metal cuts in order to form metal wires from metal fills that have been cut, and providing extended locations for extended metal cuts in order to cut adjacent metal fills. The adjacent metal fills are the metal fills that are adjacent to the predefined locations for the required metal cuts, and the extended metal cuts extend beyond the required metal cuts. Also, the method includes performing the required metal cuts into the metal fills and the extended metal cuts into the adjacent metal fills.

According to one or more embodiments, a method of optimizing self-aligned double patterning is provided. The method includes providing predefined locations for required metal cuts in order to form metal wires from metal fills that have been cut, and prioritizing the metal wires, such that a highest priority to a lowest priority is determined for the metal wires. The method includes expanding the predefined locations for the required metal cuts to have extended locations for extended metal cuts in order to cut adjacent metal fills. The adjacent metal fills are the metal fills that are adjacent to the predefined locations for the required metal cuts, and the extended metal cuts extend beyond the required metal cuts. The metal wires having been prioritized from the highest priority to the lowest priority are associated with the extended locations for the extended metal cuts because the extended locations are expanded from the predefined locations. Also, the method includes performing a check on the extended locations for the extended metal cuts in an order of the highest priority to the lowest priority of the extended locations for the extended metal cuts, such that a probability of having to remove the extended locations associated with the metal wires having a higher priority is smaller than having to remove the extended locations associated with the metal wires having a lower priority. Further, the method includes performing the required metal cuts into the metal fills and the extended metal cuts into the adjacent metal fills.

According to one or more embodiments, a structure formed by self-aligned double patterning is provided. The structure includes wire metals formed by cutting metal fills to form required metal cuts, and adjacent metal fills of the metal fills, the adjacent metal fills including extended cuts. The extended cuts are aligned to the required metal cuts, and the required metal cuts and the extended cuts are spaces of removed metal from the metal fills.

According to one or more embodiments, a computer program product of a design for optimizing self-aligned double patterning is provided. The computer program product includes a computer readable storage medium having program instructions embodied therewith, where the computer readable storage medium is not a transitory signal per se. The program instructions readable are by a computer to cause the computer to perform a method. The method includes providing predefined locations for required metal cuts in order to form metal wires from metal fills that have been cut, and providing extended locations for extended metal cuts in order to cut adjacent metal fills. The adjacent metal fills are the metal fills that are adjacent to the predefined locations for the required metal cuts, and the extended metal cuts extend beyond the required metal cuts. Also, the method includes causing fabrication equipment to perform the required metal cuts into the metal fills and the extended metal cuts into the adjacent metal fills.

According to one or more embodiments, a computer program product of a design for optimizing self-aligned double patterning is provided. The computer program product includes a computer readable storage medium having program instructions embodied therewith, where the computer readable storage medium is not a transitory signal per se. The program instructions are readable by a computer to cause the computer to perform a method. The method includes providing predefined locations for required metal cuts in order to form metal wires from metal fills that have been cut, and prioritizing the metal wires, such that a highest priority to a lowest priority is determined for the metal wires. The method includes expanding the predefined locations for the required metal cuts to have extended locations for extended metal cuts in order to cut adjacent metal fills. The adjacent metal fills are the metal fills that are adjacent to the predefined locations for the required metal cuts, and the extended metal cuts extend beyond the required metal cuts. The metal wires having been prioritized from the highest priority to the lowest priority are associated with the extended locations for the extended metal cuts because the extended locations are expanded from the predefined locations. Also, the method includes performing a check on the extended locations for the extended metal cuts in an order of the highest priority to the lowest priority of the extended locations for the extended metal cuts, such that a probability of having to remove the extended locations associated with the metal wires having a higher priority is smaller than having to remove the extended locations associated with the metal wires having a lower priority. Further, the method includes causing fabrication equipment to perform the required metal cuts into the metal fills and the extended metal cuts into the adjacent metal fills.

BRIEF DESCRIPTION OF THE DRAWINGS

FIG. 1 is a top-down view depicting a desired layout according to one or more embodiments.

FIG. 2 is a top-down of an example layout from the self-aligned double-patterning (SADP) process.

FIG. 12 is a flow chart of a method of optimizing self-aligned double patterning according to one or more embodiments.

FIG. 13 is a flow chart of a method of optimizing self-aligned double patterning according to one or more embodiments.

DETAILED DESCRIPTION

Figure 3:
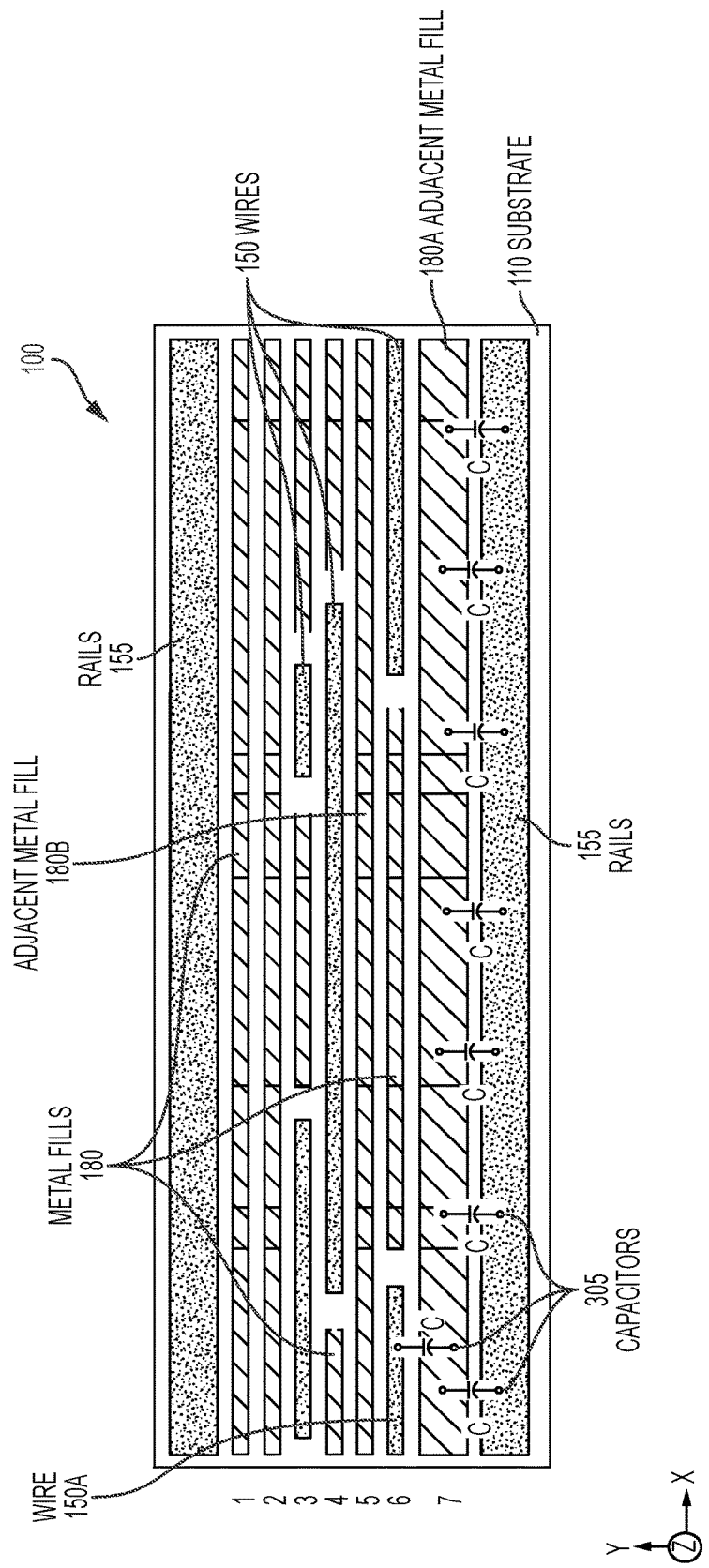
FIG. 3 is a top-down view of the metal layout illustrating the penalty a performance.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

A basic SADP process is one of the techniques for processing metal layers at 10 nanometers (nm) technology node and below. SADP uses a deposition and etch step process to create spacers surrounding a patterned shape. As understood by one skilled in the art, there are two masking steps: the first mask is called the mandrel mask and the second mask is called the block mask. These masks are quite different from the masks normally utilized in single-patterning or litho-etch-litho-etch (LELE) double patterning processes. Because spacer material is deposited on each side of the original shape, two shapes are created for every one shape originally defined, essentially pitch splitting the original lines (e.g., two mandrel mask shapes produce four spacers at half the pitch). In the metal process application, the spacers define the gaps that will become dielectric material between the desired trenches that will be filled with copper to form the interconnect wires. Because these gaps between the wires are to contain dielectric material, this form of SADP is called spacer-is-dielectric (SID).

Additionally, there is an alternative approach to SID SADP that can help with this issue. The alternative SADP uses an alternate mandrel-fill/cut-mask approach. The initial coloring assignment of the drawn shapes to mandrel and non-mandrel is the same as the previous approach. However, the mandrel mask is different. The mandrel shapes are extended horizontally to the borders of the region being processed. In addition, complete dummy mandrel rows are added to fill the space vertically, which is a technique called mandrel fill. The end result is that the entire region now looks like a diffraction grating of parallel lines, which is easier from a lithography standpoint. When one gets to the second mask, there is no longer a block mask, but a cut mask in its place. A cut mask contains simple rectangles that create cuts in the lines, which are also much more lithographically-friendly than a complex block mask. The end result on the wafer is the originally desired drawn shapes (i.e., desired wires), but one also gets a grid of other lines, which are dummy lines, in addition. These dummy lines are not electrically connected to anything but these dummy lines present a problem. Particularly, this approach is much more robust from a manufacturing standpoint, but it does incur an extra capacitance, due to all the dummy mandrel and non-mandrel shapes around the drawn shapes at minimum distance. It is noted that non-mandrel shapes are on the mask, but are a representation of the metal line formed between the mandrels.

These extra lines are referred to as metal fills herein. Also, the extra lines are known as dummy wires, dummy mandrel shapes, dummy lines, floating lines, etc. However, the cut metal fills that according to predefined locations form the metal wires (signal wires), which are intended.

The back-end-of-line (BEOL) using SADP leaves these metal fills in the unused area. These metal fills add parasitic capacitances to real metal wires and negatively impact the circuit performance and power. Although it is possible to cut the metal fill to reduce the parasitic capacitance, the challenge becomes where to cut the fill metal to optimize the performance improvement and avoid the design rules check (DRC) errors. One or more embodiments discuss methods to cut the metal fills to optimize the performance improvement while avoiding DRC errors.

FIG. 1 is a top-down view depicting a desired layout. The desired layout 105 includes a substrate 110. The substrate 110 can be a wafer having devices formed on the substrate 110. Example devices include transistors, capacitors, contacts, etc. The various devices form an integrated circuit.

As an example, the desired layout 105 is illustrated with 5 metal wires 150 and 2 power rails 155. The 5 metal wires 150 are connected to the various devices in a predefined arrangement, and the various devices can be underneath and/or connected to at least a portion of respective metal wires 150 such that a connection can be made.

FIG. 2 is a top-down of an example layout generated as a result of the SADP process. One skilled in the art understands the SADP process to form metal wires on integrated circuits. In FIG. 2, the layout 100 illustrates the results of the SADP process utilized to create/form the 5 metal wires 150 from metal fills 180 (dummy wire). Even after the metal wires 150 have been formed, the metal fills 180 remain on the substrate 110. The wanted part of the metal fill 180 is now a metal wire 150, while the unwanted part of the metal fill 180 remains and is simply designed as 180. It should be appreciated that all metal wires 150 were formed out of original metal fills 180 prior to being cut into the desired metal wires 150. In layout 100, a metal wire 150 is on the same row as the metal fill 180 from which the metal wire 150 was cut. In the example layout 100, there are 7 rows of metal fills 180 excluding the power rails, and one or more metal wires 150 have been formed on rows 3, 4, and 6. Even though the metal wires 150 have been formed by cutting the metal fills 180 on rows 3, 4, and 6, segments (remnants) of the metal fills 180 still remain on rows 3, 4, and 6 along with the metal wires 150. The length of the metal wires 150 and metal fills 180 extend in the x-axis, and the width of the metal wires 150 are in the y-axis.

The metal fills 180 and subsequently the metal wires 150 formed by cutting selected metal fills 180 can be any suitable conductive material, and examples include copper, aluminum, gold, palladium, etc. The predefined locations to cut the selected metal fills 180 to result in the metal wires 150 is known in advance, as understood by one skilled in the art.

As a characteristic of the SADP process, there will be metal fills 180 including segments of the metal fills 180 and the entirely of the metal fill 180 on some rows, which remain in the layout 100. The remaining metal fills 180 are recognized as a SADP penalty on performance because of parasitic capacitance. FIG. 3 is a top-down view of the metal layout 100 illustrating the penalty on performance. One of the 5 metal wires 150 is designated as metal wire 150A on row 6 for explanation purposes. The wire metal 150A is highlighted to illustrate the effect of parasitic capacitance coupling to the metal wire 150A. It is appreciated that other metal wires 150 receive the effects of parasitic capacitance but metal wire 150 is discussed for illustration. In this example, there are 7 parasitic capacitors C 305 formed between the bottom power rail 155 and the metal fill 180 on row 7. Also, there is 1 parasitic capacitor C 305 formed between the metal fill 180 on row 7 and the wire 150A. For explanation purposes, the metal fill 180 on row 7 is designated as the adjacent metal fill 180A with respect to the wire 150A.

An example coupling capacitance in metal wire 150A as a result of the parasitic capacitance of parasitic capacitors 305 is $$C_{coupling} = \frac{1}{\frac{1}{C} + \frac{1}{7 \times C}} = \frac{7}{8}C. \quad \text{Eq. 1}$$

As can be seen, the parasitic capacitor C 305 couples to the adjacent metal fill 180A on row 7 and to the metal wire 150A on row 6, thereby causing the chain effect or coupling effect of the other 7 parasitic capacitors C 305 connected to the bottom power rail 155. For simplicity, it should be appreciated that Eq. 1 is for illustration purposes only and does not take into account the parasitic capacitance between the above adjacent metal fill 180B on row 5 and the wire 150A on row 6. However, the wire 150A experiences the parasitic capacitance from both adjacent metal fills 180A and 180B. It should be appreciated that an analogous analysis (similar to Eq. 1) can be performed to determine the parasitic capacitance felt by the wire 150A with respect to the adjacent metal fill 180B.

Figure 4:
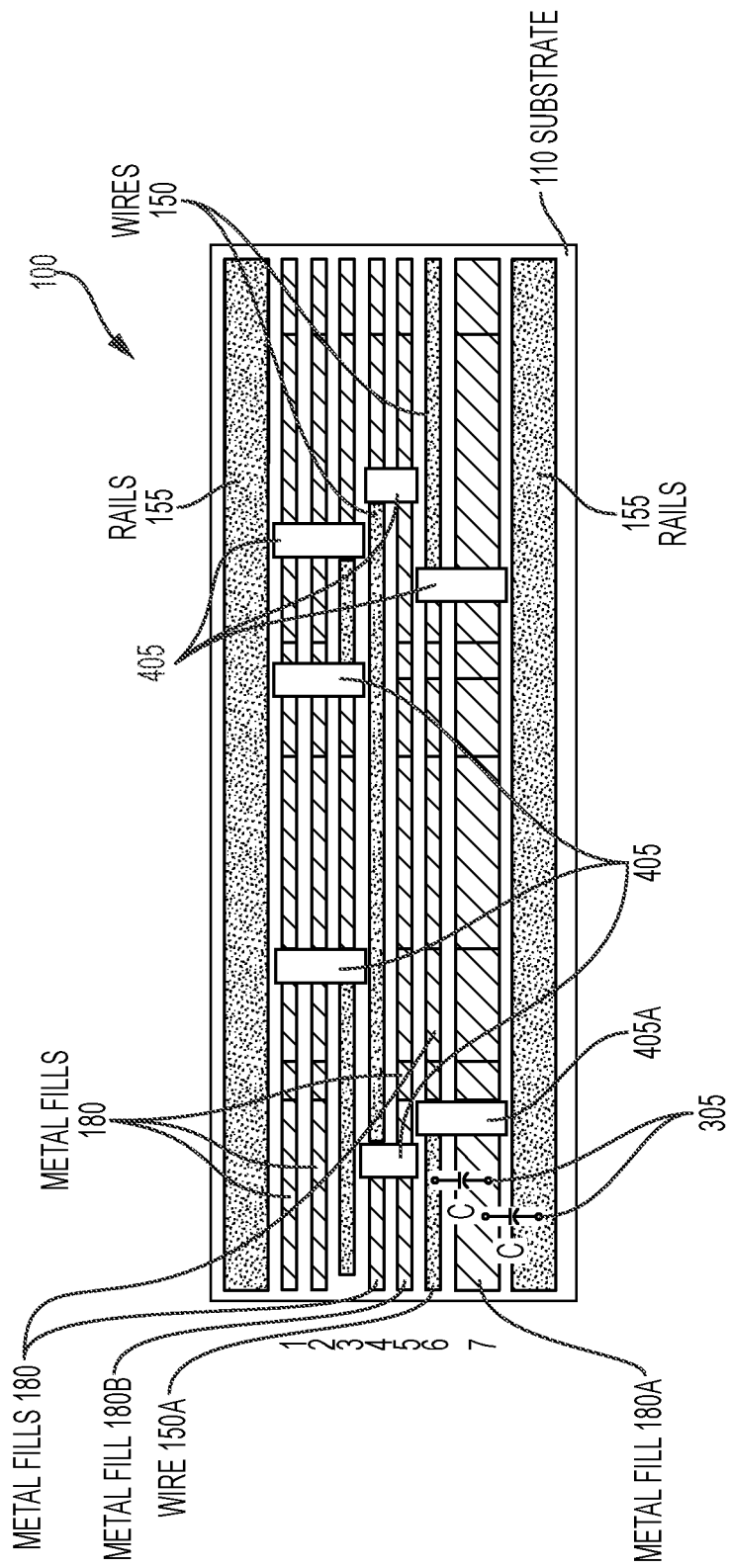
FIG. 4 is a top-down view of the layout with an extended cut according to one or more embodiments.

FIG. 4 is a top-down view of the layout 100 with an extended cut according to one or more embodiments. In FIG. 4, cuts 405 in the metal fill 180 are not only made on the rows on which a metal wire 105 is to be formed but cuts 405 are also extend to adjacent metal fills 180 in which no metal wire 150 is formed. By extending the cuts 405 beyond the predefined location (row) on which the metal wire 150 is to be formed such that adjacent metal fills 180 are now cut, this cut 405 reduces the parasitic capacitance of the metal wires 150 in the entire layout 100, thus reducing the SADP fill performance penalty. Referring back to the previous example of the parasitic capacitance affecting the wire 150A, FIG. 4 highlights the cut 405A. The cut 405A not only cuts the metal fill 180 on row 6 to thereby form metal wire 150A but also cuts the adjacent metal fill 180A immediately below the wire 150A in the y-axis. It should be appreciated that the metal fills 180 are in the same plane, and below refers to being at a lower location within the same plane. During this process, this cut 405 extends to the adjacent metal fill 180A. Because of this metal cut 405A to cut the adjacent metal fill 180A, the technique reduces the parasitic capacitance (coupling) between wire 150A and adjacent metal fill 180A, and only 2 parasitic capacitors 305 are illustrated as affecting the metal wire 150A in FIG. 4. Accordingly, the following is an example of the coupling capacitance in metal wire 150A as a result of the parasitic capacitance of parasitic capacitors 305 (after the cut to the adjacent metal fill 180A)

$$C_{coupling} = \frac{1}{\frac{1}{C} + \frac{1}{C}} = \frac{1}{2}C. \quad \text{Eq. 2}$$

Although this example is shown for the wire 150A, this technique of using the cut 405, which is extended to cut adjacent metal fills 180 along with cutting the actual metal fills 180 that are needed to form the metal wires 150, results in reduced coupling capacitance (i.e., reduced parasitic capacitance) to adjacent metal fills 180, thereby reducing parasitic capacitance to the metal wires 150.

In FIG. 4, the cut 405 includes both the normal metal cut in the SADP process which is the required metal cut to form the metal wire 150, along with the extended cut which is not required to form the wire metal 150 but is added in order to cut adjacent metal fills 180 to thereby reduce the parasitic capacitance. The normal metal cut to form the metal wire 150 in SADP can also be referred to as the required metal cut, the wire cut, etc., because the normal meta cut (505 in FIG. 5) is required to form the metal wire 150. The extended cut that cuts the adjacent metal fills 180 can be referred to as the adjacent cut, adjacent metal cut, additional cut, etc. As an example illustration, FIG. 5 is a top-down view of the metal layout 100 more clearly detailing both the normal or required cuts and the extended cuts according to one or more embodiments.

Figure 5:
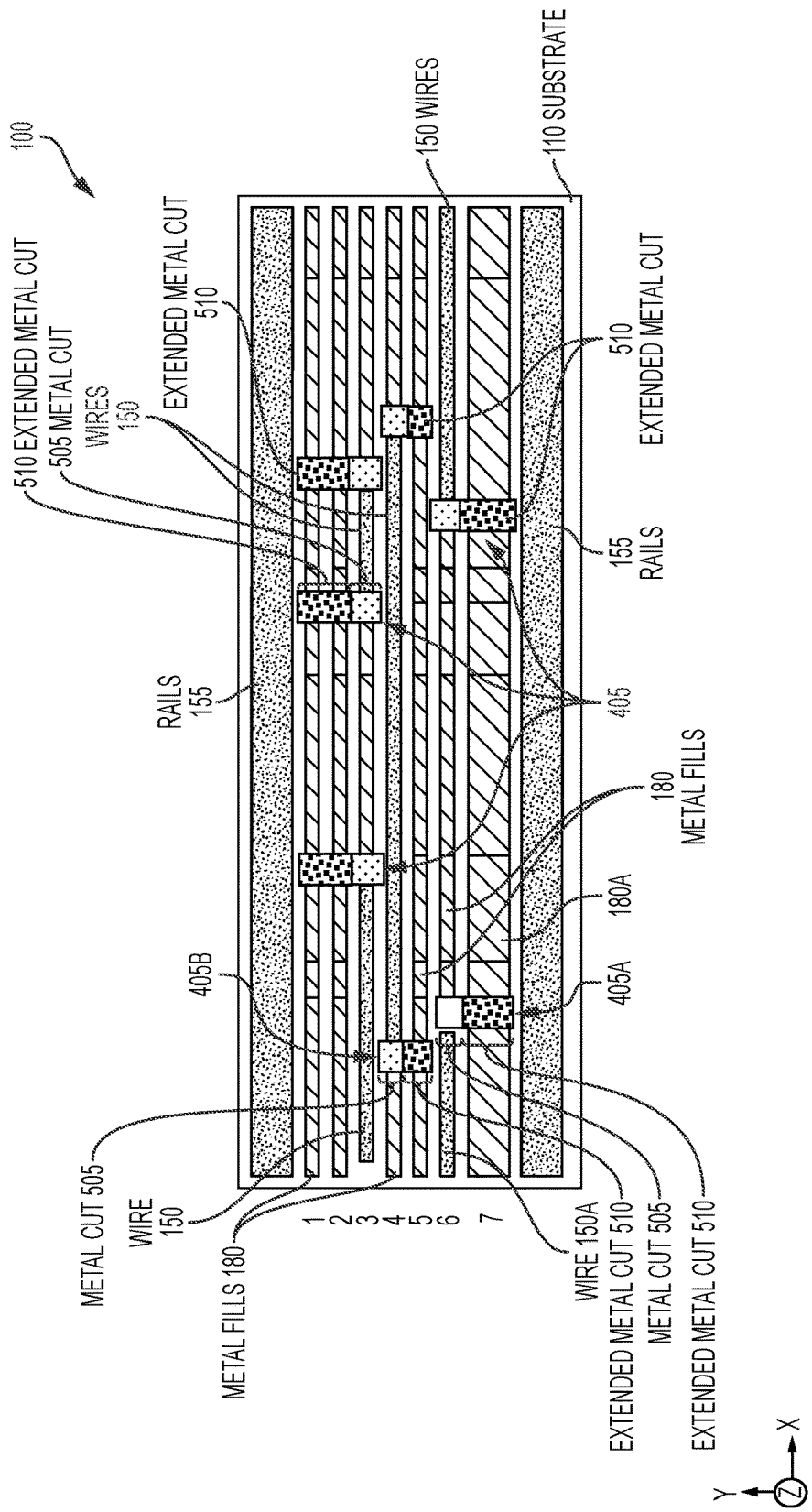
FIG. 5 is a top-down view of the metal layout depicting both the normal or required cuts and the extended cuts according to one or more embodiments.

In FIG. 5, the cut 405 shows the required metal cut 505. In this example, there are 7 required metal cuts 505 performed on metal fills 180, such that the 5 metal wires 150 are formed. Extended cuts 510 are aligned to the same length in the x-axis as the required cut 505, such that the extended cuts 510 extend further in the y-axis than the required cut 505. Each extended cut 510 cuts an adjacent metal fill 180 that is not required to be cut during the required cut 505 (which forms the metal wire 150). Although the cut 405 separately delineates the required metal cuts 505 from the extended metal cuts 510, the cut 405 can simultaneously cut both the required metal cuts 505 and the extended metal cuts 510. In one implementation, there can be situations in which one or more certain extended metal cuts 510 can utilize a different mask than its associated required metal cuts 505, so as to meet a minimum spacing requirement as discussed further below.

Referring back to the example utilizing the wire 150A, the wire 150A is formed by the left required metal cut 505 to metal fill 180 on row 6. The optimization (i.e., reduction) to the parasitic capacitance affecting the wire 150A is by the extended cut 510 on the adjacent metal fill 180A on row 7. It can be seen that the combination of the required metal cut 505 and the extended cut 510 is depicted as cut 405A.

Figure 6:
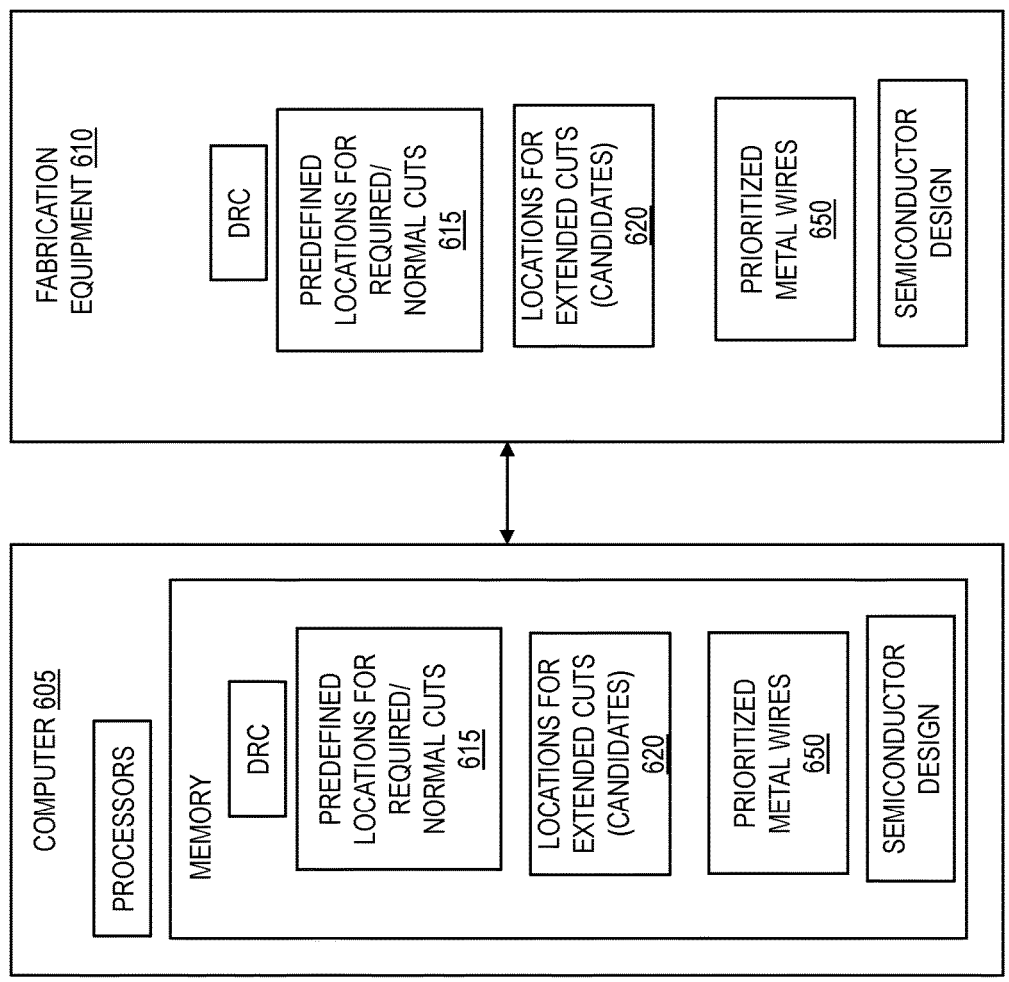
FIG. 6 illustrates a computer operatively coupled to semiconductor fabrication equipment according to one or more embodiments.

There can be various techniques to illustrate embodiments discussed herein. One method is to extend the cut into adjacent metal fills 180 while not committing a design rules check (DRC) error. FIG. 6 illustrates a computer 605 operatively coupled to semiconductor fabrication equipment 610 according to one or more embodiments. Semiconductor fabrication equipment 610 is utilized to form semiconductor structures by utilizing standard fabrication techniques as understood by one skilled in the art. Fabrication equipment 610 can include photolithography equipment, chemical mechanical polishing machines, deposition chambers, electron beam equipment, etc. The photolithography equipment can include measurement instrumentation (for performing the DRC) and etching/cutting machines for cutting the cuts 405. There are many different types of etching that can be utilized to perform the cuts 405. The semiconductor fabrication equipment 610 can be integrated with and/or be connected to the computer 605 having processors, memory, computer-executable instructions, and user interface devices, and the computer-executable instructions are configured to control the semiconductor fabrication equipment 610 to perform the methods discussed herein, according to one or more embodiments. The semiconductor fabrication equipment 610 can be operated manually, be semi-automated, and/or be fully automated to perform the methods discussed herein.

Figure 7:
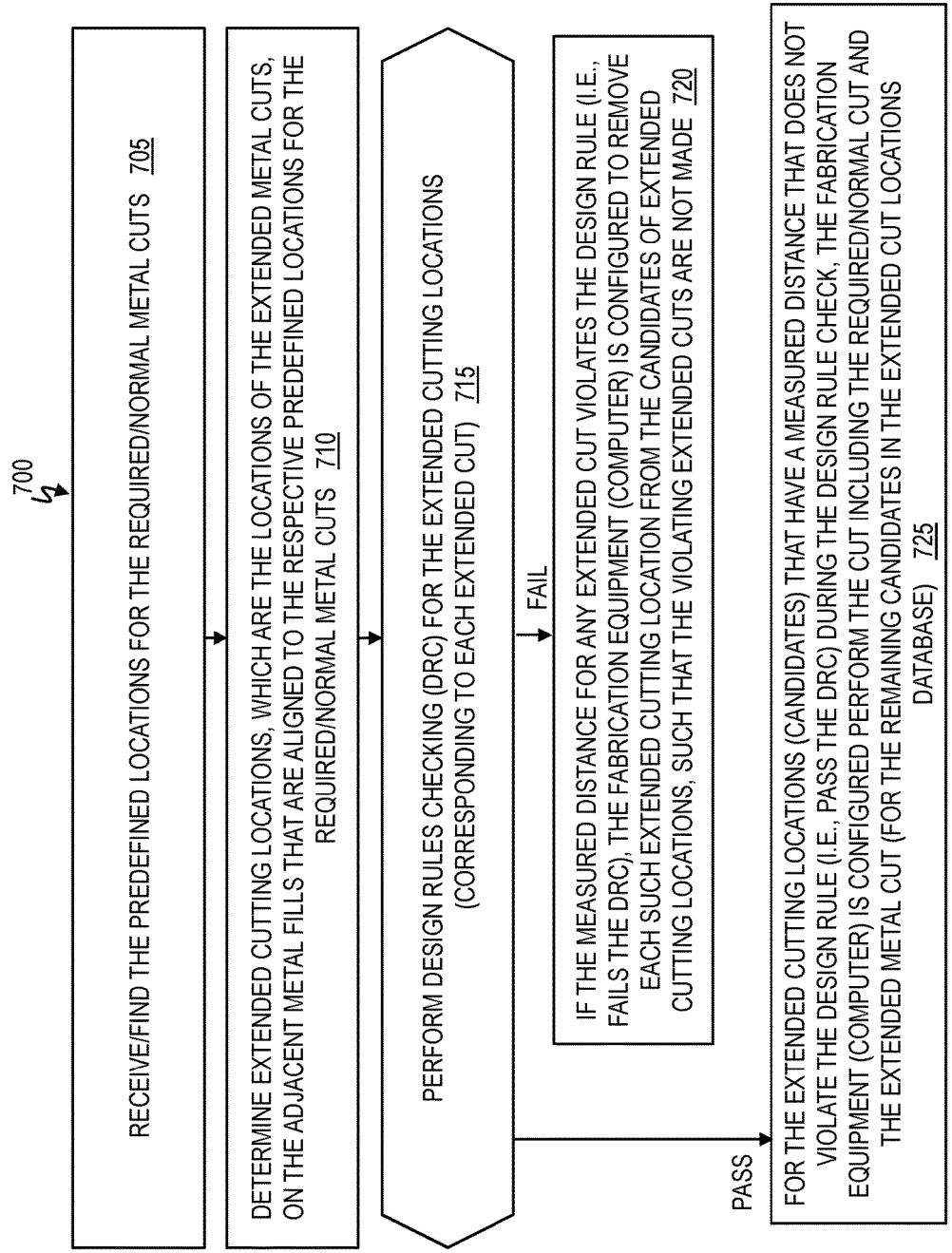
FIG. 7 is a flow chart of a self-aligned double-patterning optimization method according to one or more embodiments.

FIG. 7 is a flow chart 700 of a SADP optimization method according to one or more embodiments. Any method discussed herein can be performed manually by an operator using the fabrication equipment 610 and/or computer 605. The method can be performed by the fabrication equipment 610 and/or the computer 605 according to preprogrammed computer-executable instructions to be fully automated and/or semi-automated. Accordingly, it is appreciated that the fabrication equipment 610 is configured to operate in accordance with methods discussed herein, and the fabrication equipment can be controlled by the computer 605 to perform one or more fabrication processes. In one or more embodiments, the method can be executed on the computer 605 as a simulation of a design (including very-large-scale-integration (VLSI), etc.) for the metal layout 100 such that the design of the layout 100 is tested (DRC) before actual fabrication.

At block 705, the fabrication equipment 610 (computer 605) is configured to receive/find the predefined locations for the required/normal metal cuts 505. The predefined locations can be stored in database 615, which can be in computer 605 and/or fabrication equipment 610. The predefined locations for the required/normal metal cuts 505 are known in advance as part of the SADP process, as understood by one skilled in the art. The predefined locations are the areas in which different metal wires 150 are to be cut, such that the metal wires 150 connect to their respective devices (e.g., transistors), metal vias, conductive material, etc., which are underneath the metal wires 150.

For each of the required/normal metal cuts 505, the fabrication equipment 610 (computer 605) is configured to check for an adjacent metal fill 180 in order to extend each of the required/normal cuts 505 to cut the adjacent metal 180. An adjacent metal fill 180 is a metal fill that is not designed to be formed into a metal wire 150. Also, the adjacent metal fill 180 is in a row that is 1 less than and/or 1 greater that the row of the metal wire 150 to which the adjacent metal fill 180 is adjacent. In other words, the adjacent metal fill 180 is next to its respective metal wire 150 in the y-axis. The metal wire 150 can have a predefined offset or fixed offset to the respective adjacent metal fill 180 in the y-axis, such that any adjacent metal fill 180 can be properly identified by the fabrication equipment 610 (computer 605).

At block 710, the fabrication equipment 610 (computer 605) is configured to determine extended cutting locations, which are the locations of the extended metal cuts 510, on the adjacent metal fills 180 that are aligned to the respective predefined locations for the required/normal metal cuts 505. The extended cutting locations (corresponding to the forthcoming extended cuts 510) are aligned in the x-axis to the required/normal cuts 505. However, the extended cutting locations extend farther or beyond the predefined locations of the required/normal cuts 505 (e.g., a fixed offset amount) in order to cut (i.e., extended metal cut 510) the respective adjacent metal fills 180. Extended cutting locations can be stored in database 620, which can be in computer 605 and/or fabrication equipment 610. In one implementation, there can be metal wires 150 on the top (i.e., above row) and bottom (below row) of the required cut 505 for a particular metal wire 150, such that the particular metal wires 150 does not have any adjacent metal fills 180. As such, the particular metal 150 does not need an extended cut from its required cut, because such an extended cut would cut a metal wire above or below.

In one implementation, the extended cutting locations can be determined by finding each of the predefined locations for the required/normal metal cuts 505 and then moving further (both up and down, e.g., decreasing row count and increasing row count) in the y-axis to each adjacent metal fill 180 not being utilized to form a metal wire 150. For each adjacent metal fill 180 not being utilized to form metal wires 150 at the aligned area in the x-axis corresponding to the required/normal metal cut 505, this adjacent metal fill 180 is a candidate for the extended metal cut 510. The area aligned in the x-axis means that the extended metal cut 510 is to be aligned (or nearly aligned) with the required/normal metal cut 505 in the x-axis as depicted by the cut 405 in FIG. 5 which details the x-axis alignment of both the required/normal metal cut 505 and the extended metal cut 510.

If there happens to be an occurrence in which there are no extended cutting locations, the process ends and no extended cuts 510 are to be made.

At block 715, once all extended cutting locations for the extended cuts 510 are found/determined, the fabrication equipment 610 (computer 605) is configured to perform design rules checking (DRC) for the extended cutting locations (corresponding to each extended cut 510). In one implementation, the DRC includes measuring the distance between each extended metal cut 510 and any other cut including both required/metal cuts 505 and other extended metal cuts 510. The DRC refers to a minimum distance that is required between cuts.

At block 720, if the measured distance for any extended cut 510 violates the design rule (i.e., fails the DRC), the fabrication equipment 610 (computer 605) is configured to remove each such extended cutting location from the candidates of extended cutting locations, such that the violating extended cuts 510 are not made.

For example, there could be a determination that distance between a particular extended cut location (for an extended cut 510) and a particular predefined location (for a required/normal cut 505) violate the minimum distance requirement of the DRC. As such, the required/normal metal cut 505 is to be performed while the particular extended cut location (for an extended cut 510) is removed as a candidate from the extended cut locations database 620, such that the extended cut is not performed. In another example, when the violation of the minimum measured distance is between two extended cut locations (for two extended cuts 510), then one of the conflicting extended cut locations is removed as a candidate from the extended cut locations database 620 such that one conflicting extended cut is not performed for the removed extended cut location; accordingly, the other extended cut location remains and its extended cut is performed because the conflicting extended cut is not going to occur. One or more embodiments can include a prioritization of extended cuts and/or extended cut locations to determine which extended cut locations as discussed further in FIG. 8. Each extended cut is made at its extended cut location.

Referring back to FIG. 7, for the extended cutting locations (candidates) that have a measured distance that does not violate the design rule (i.e., pass the DRC) during the design rule check, the fabrication equipment 610 (computer 605) is configured perform the cut 405 including the required/normal cut 505 and the extended metal cut 510 (for the remaining candidates in the extended cut locations database 620) at block 725.

The fabrication equipment 610 (computer 605) is configured to cut the metal fills 180 to form the metal layout 100 by utilizing the predefined locations to make the required/normal metal cuts 505 and by utilizing the extended cut locations to make the extended metal cuts 510, both cuts 505 and 510 can be made as cut 405. The extended cut locations and the predefined locations can be identified using an x-y grid.

Figure 8:
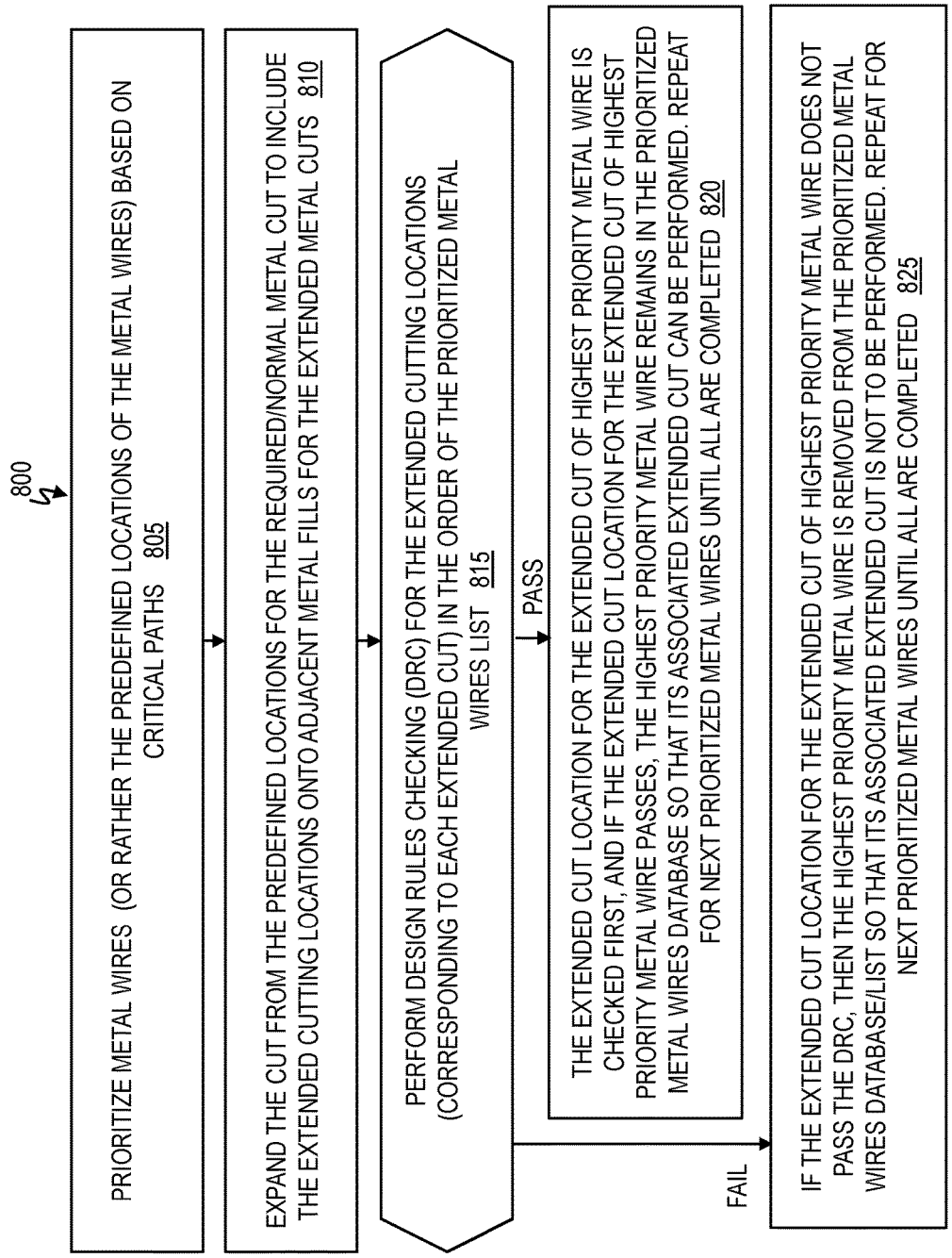
FIG. 8 is a flow chart of a self-aligned double-patterning optimization method according to one or more embodiments.

FIG. 8 is a flow chart 800 of a SADP optimization method according to one or more embodiments. FIG. 8 can include the any of the features discussed in FIGS. 1-7.

At block 805, the fabrication equipment 610 (computer 605) is configured prioritize metal wires 150 (or rather the predefined locations of the metal wires 150) based on critical paths. The ranking of the prioritized metal wires 150 (or the metal wires 150 to be formed) can be stored in a prioritized metal wires list/database 650. A critical path refers to the underlying connection to the device connected the metal wire 150. For example, one metal wire 150 can be connected to a device such as, a capacitor, a gate of a transistor, a source of a transistor, a drain of a transistor, a memory element, etc. When a device is predefined as critical, the wire connection of the metal wire 150 is then considered critical, thereby forming a critical path between the critical device and its corresponding wire metal 150. As understood by one skilled in the art, standard analysis can be performed to determine which metal wire 150 is critical. For example, a parasitic extraction analysis can be performed on the metal wires 150 to determine which metal wires 150 have a higher priority, and the metal wires 150 can be ranked from highest parasitic capacitance to lowest parasitic capacitance. Accordingly, a metal wire 150 with the higher parasitic capacitance is ranked with a higher priority in the prioritized metal wires 650 than a metal wire 150 having a lower parasitic capacitance. A timing analysis can be performed to determine which metal wires 150 have higher priority based on which metal wires 150 fail to meeting their required timing according to a predefined time. Each metal wire 150 can be required to fall within a predefined timing, and metal wires 150 that have the highest margin of timing error (e.g., fall outside of the predefined timing by the largest amount) are given a higher priority in the prioritized metal wires 650 than metal wires 150 having a smaller margin of timing error. Also, metal wires 150 having the smaller margin of timing error are ranked higher than metal wires 150 having no timing error.

At block 810, the fabrication equipment 610 (computer 605) is configured to expand the cut from the predefined locations for the required/normal metal cut 505 to include the extended cutting locations onto adjacent metal fills 180 for the extended metal cuts 510. The expanded cut 405 includes both the required/normal metal cut 505 with its extended metal cut 510.

At block 815, once the extended cutting locations for the extended cuts 510 are found/determined/expanded, the fabrication equipment 610 (computer 605) is configured to perform design rules checking (DRC) for the extended cutting locations (corresponding to each extended cut 510) in the order of the prioritized metal wires list 650. Block 815 is analogous to block 715, except for in block 815, the fabrication equipment 610 (computer 605) is configured to perform the DRC in the order of the highest priority metal wire 150 and its corresponding extended cut 510 of the adjacent metal fill 180 to the lowest priority metal 150 and its corresponding extended cut 510 of its adjacent metal fill 180. Accordingly, the design rule check is performed in order from highest priority metal wire (first) to lowest priority metal wire (last). First, the extended cut location for the extended cut 510 of highest priority metal wire 150 is checked, and if the extended cut location for the extended cut 510 of highest priority metal wire 150 passes, the highest priority metal wire 150 remains in the prioritized metal wires database 650 so that its associated extended cut 510 can be performed at block 820. If the extended cut location for the extended cut 510 of highest priority metal wire 150 does not pass the DRC, then the highest priority metal wire 150 is removed from the prioritized metal wires database 650 so that its associated extended cut 510 is not to be performed at block 825.

The fabrication equipment 610 (computer 605) is configured to descend to the next extended cut 510 corresponding to and/or supporting the next highest priority metal wire 150 and then determine if that next extended cut 510 violates the measured distance for the DRC at block 820. This process of descending down the prioritized metal wires list 650 continues through the lowest priority metal wire 150. In other words, this process in blocks 815, 820, and 825 repeats for each metal wire 150 (having an extended cut) in the prioritized metal wire list 650 until process is completed for the lowest priority metal wire 150. By having the DRC performed separately and in the prioritized order for each extended cut 510 that has been extended for its associated metal wire 150, the fabrication equipment 610 (computer 605) is configured to incrementally add extended cuts 510 in the prioritized metal wire order, such that the extended metal cuts 510 associated with the highest priority metal wires 150 are more assured of being performed without DRC errors. In one implementation, it is expected that the DRC error can be violated as the fabrication equipment 610 (computer 605) descends down the prioritized metal wires list 650 from highest to lowest priority meal wires 150, such that the highest priority metal wires 150 pass the DRC with error because the metal layout 100 has not been encumbered with extended cuts 510 associated with the lower priority metal wires 150. For example, extended cuts 501 associated with the highest priority metal wires 150 pass with a higher probability than extended cuts associated with the lowest priority metal wires 150.

In one example, the metal wires 150 can be ranked 1-N, where N is the lowest priority. In this case, it is assumed that the metal wire 150A is the highest priority metal wire and that the expansion of the predefined location for the metal wire 150A results in the extended cut location for the extended cut 510 in cut 405A. As noted above in block 815, the DRC includes measuring the distance between each extended metal cut 510 and any other cut including both required/metal cuts 505 and other extended metal cuts 510 (there are no other extended metal cuts 510 for comparison in this case because it is assumed that the metal wire 150A is the highest priority metal wire).

In accordance with the prioritized metal wires list 650 discussed in FIG. 8, the fabrication equipment 610 (computer 605) is configured to cut the metal fills 180 to form the metal layout 100 by utilizing the predefined locations to make the required/normal metal cuts 505 and by utilizing the extended locations to make the extended metal cuts 510, in which both cuts 505 and 510 can be made as cut 405 and the highest priority metal wires 150 are assured of having their associated extended metal cuts 510 performed.

Figure 9:
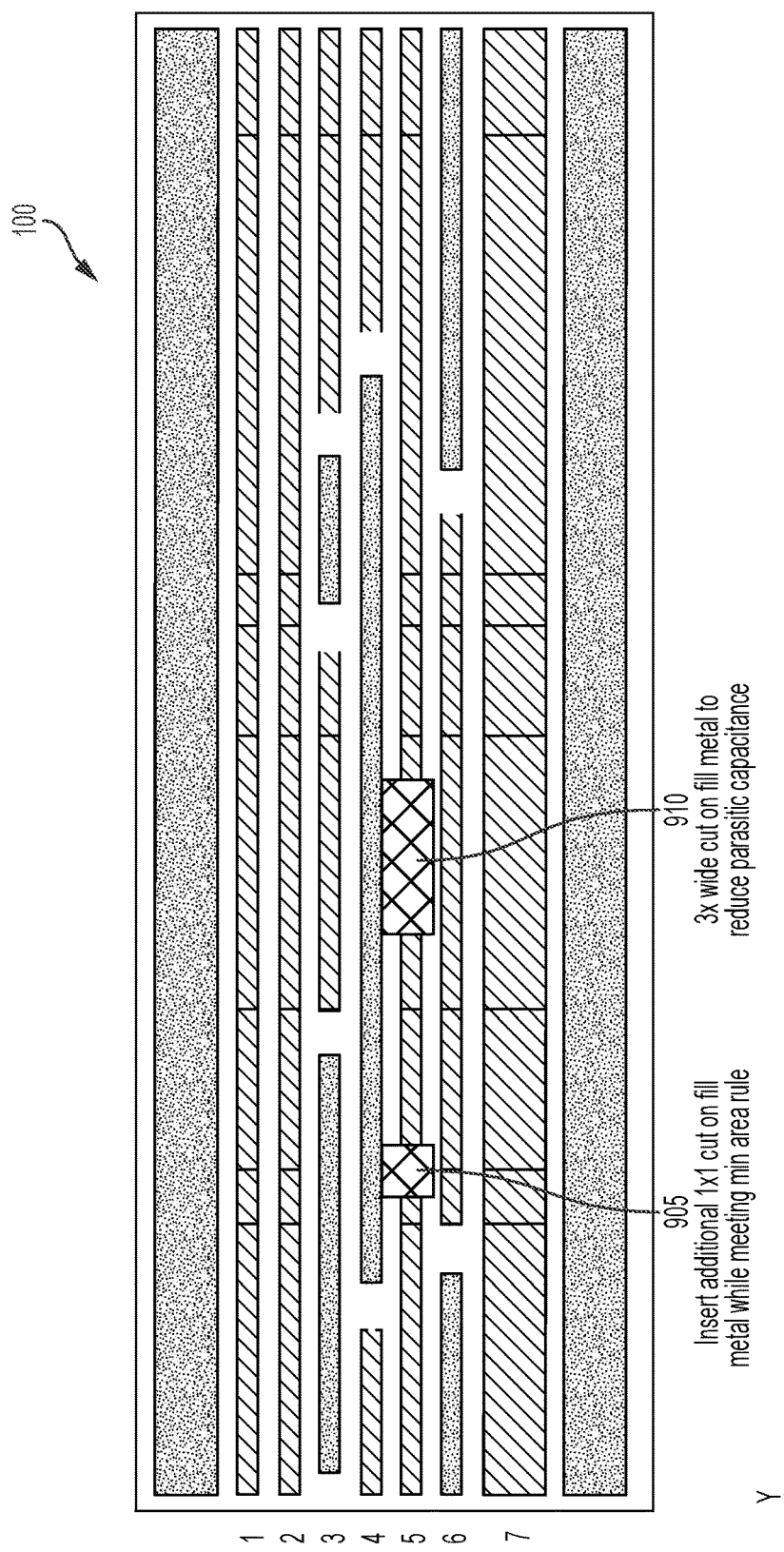
FIG. 9 is a top-down view of the layout according to one or more embodiments.

FIG. 9 is a top-down view of the layout 100 according to one or more embodiments. FIG. 9 shows that additional cuts can be inserted to cut a long metal fill 180 while meeting the minimum area rule of the DRC. A long metal fill 180 has a predefined length in the x-axis. In FIG. 9, the cut 905 is an example of a 1×1 cut and the cut 910 is an example of a 3×1 cut (3 times wide) of the metal fill 180. The cuts 905 and/or 910 can be included in addition to the methods discussed herein, and the cuts 905 and 910 are checked for DRC as discussed herein.

Figure 10:
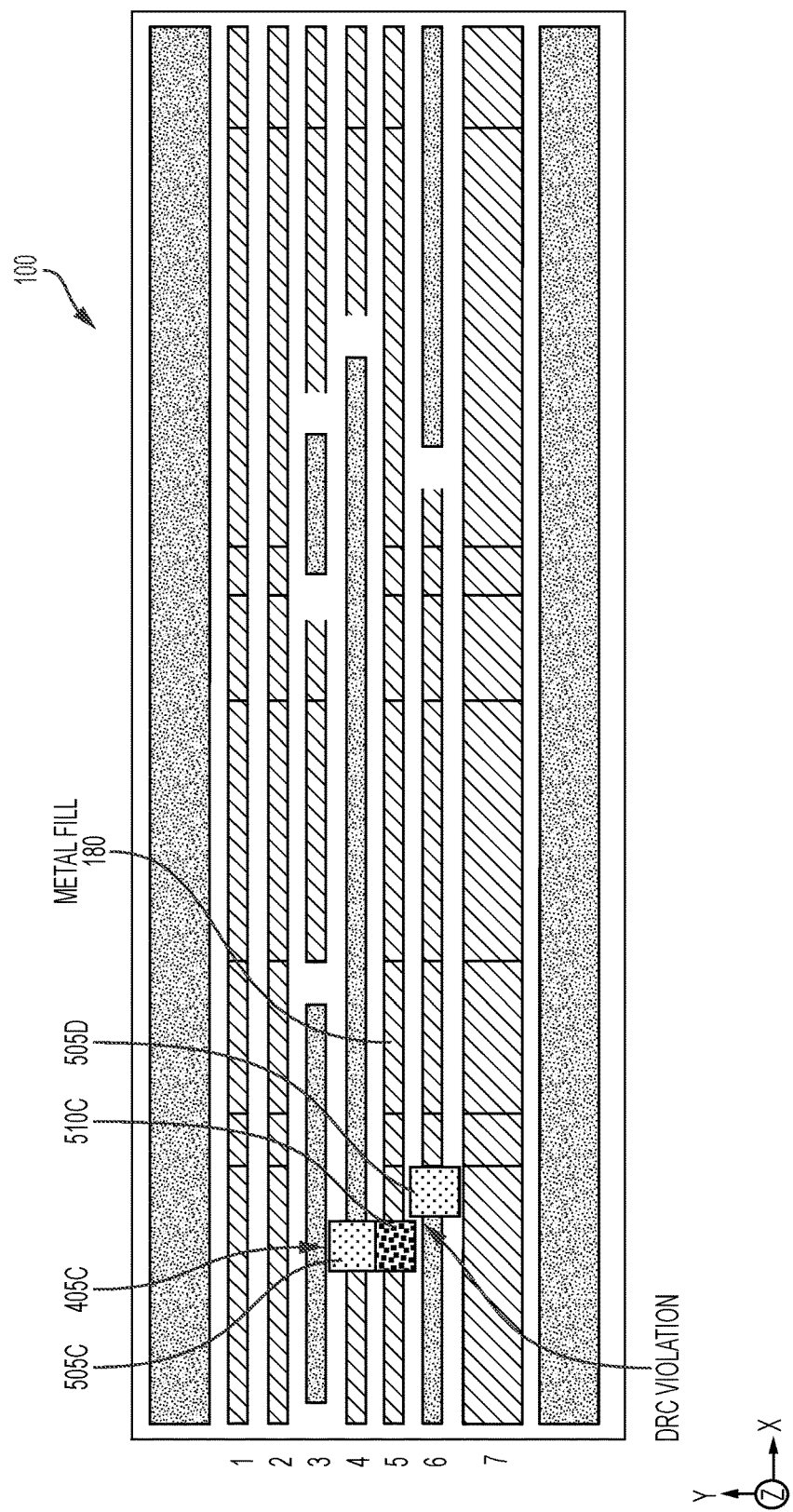
FIG. 10 is a top-down view of the layout according to one or more embodiments.
Figure 11:
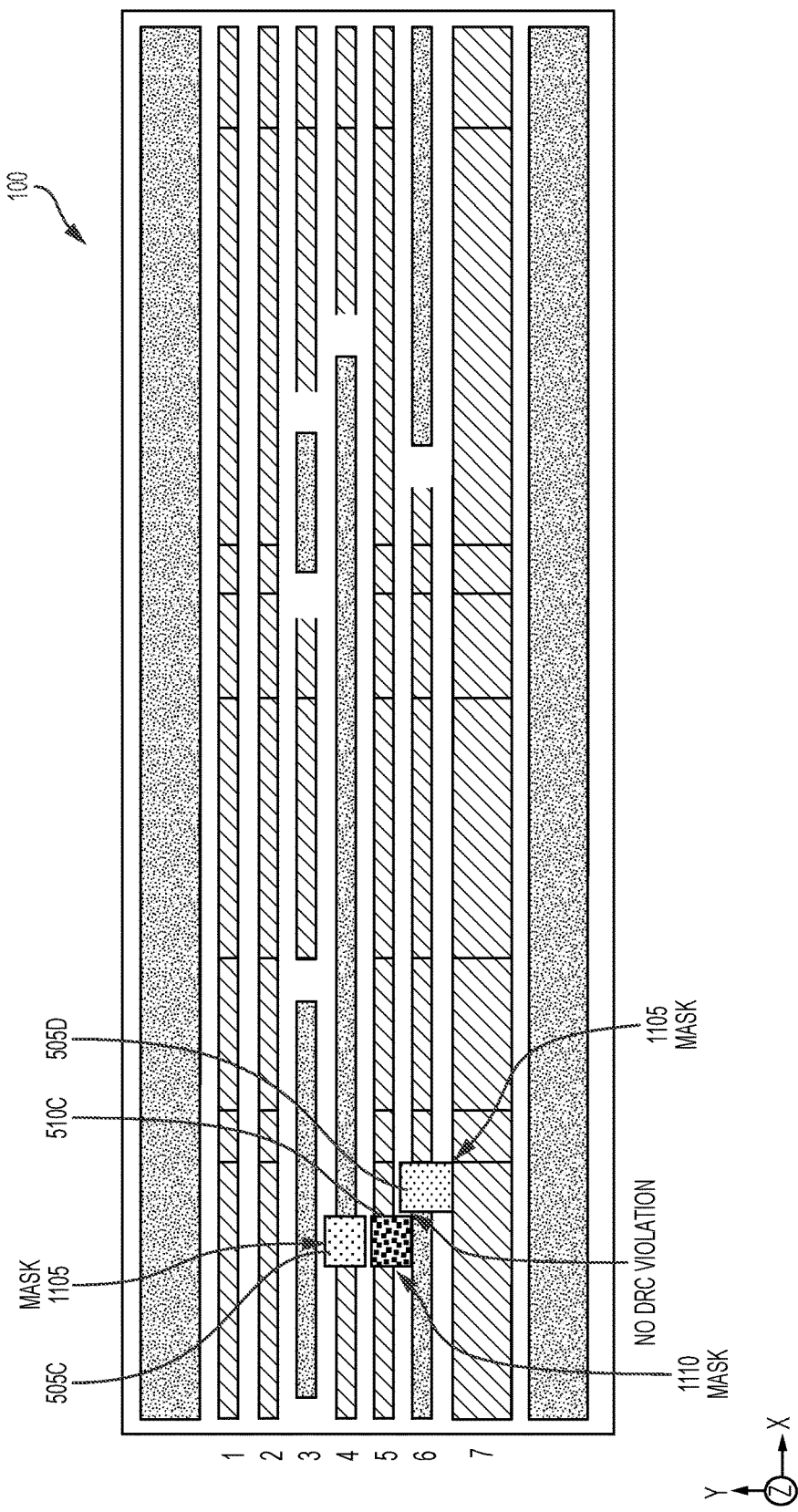
FIG. 11 is a top-down view of the layout to illustrate resolving a cut-to-cut violation according to one or more embodiments.

FIG. 10 is a top-down view of the layout 100 according to one or more embodiments. It is assumed that cut 405C and cut 505D have a DRC violation. The extended cut 510C into the metal fill 180 creates a cut-to-cut minimum space violation. Accordingly, the state-of-the-art technique would need to remove the extended cut 510C in FIG. 10. However, one or more embodiments provide a technique to address this situation. FIG. 11 is a top-down view of the layout 100 to illustrate resolving a cut-to-cut violation according to one or more embodiments. In the design (e.g., VLSI) of the layout 100, two separate colors are utilized where one color is utilized to make required/normal cuts 505C and 505D while another color is utilized to make the extended cut 510C in FIG. 11. Utilizing two separate colors in the design means that two separate masks are utilized to perform the cuts such that no DRC violation occurs. One mask is designated as mask 1105 which is utilized to make required/normal cuts 505C and 505D, while another mask 1110 is utilized to make the extended cut 510. Using the two separate masks 1105 and 1110 can be applied to rectify any DRC error or violation discussed in the methods herein, thereby avoiding violations of the minimum distance requirement (for the same mask).

FIG. 12 is a flow chart 1200 of a method of optimizing SADP according to one or more embodiments. Reference can be made to FIGS. 1-11 discussed herein.

At block 1205, the fabrication equipment 610 (computer 605) is configured to receive/provide predefined locations for required metal cuts 505 in order to form metal wires 150 from metal fills 180 that have been cut.

At block 1210, the fabrication equipment 610 (computer 605) is configured to provide extended locations for extended metal cuts 510 in order to cut adjacent metal fills 180, where the adjacent metal fills 180 are the metal fills 180 that are adjacent to the predefined locations for the required metal cuts 505. The extended metal cuts 510 extend beyond the required metal cuts 505.

At block 1215, the fabrication equipment 610 (computer 605) is configured to perform/execute the required metal cuts 505 into the metal fills 180 and the extended metal cuts 510 into the adjacent metal fills 180.

The fabrication equipment 610 (computer 605) is configured to perform a check (e.g., DRC) to determine if the extended locations for the extended metal cuts violate design rules. The fabrication equipment 610 (computer 605) is configured to remove the extended locations for the extended metal cuts that violate the design rules.

The fabrication equipment 610 (computer 605) is configured to, for a given extended location for a given extended metal cut that violates a minimum spacing requirement of the design rules with respect to a given cut, utilize a first mask to make the given extended metal cut and a second mask to make the given cut, thereby avoiding the minimum spacing requirement. The required metal cuts 505 into the metal fills 180 and the extended metal cuts 510 into the adjacent metal fills 180 are both performed simultaneously.

The extended metal cuts into the adjacent metal fills reduce parasitic capacitance. The adjacent metal fills 180 are adjacent to the metal wires 150 having been formed by the required metal cuts 505 at the predefined locations, and a given adjacent metal fill (e.g., 180A) for a given metal wire (e.g., 150A) is not on a same row as the given metal wire (e.g., 150A).

A given predefined location is in a first row (e.g., row 6), and the given predefined location is for a given required metal cut (e.g., metal cut 505) to form a given metal wire (e.g., 150A) from a given metal fill (e.g., metal fill 180 on row 6). A given extended location is in a second row (e.g., row 7), and the given extended location is for a given extended metal cut (e.g., extended metal cut 510 on row 7 aligned to the metal cut 505 for wire 150A) to cut a given adjacent metal fill. The given extended location for the given extended metal cut is aligned to the given predefined location for the given required metal cut, such that the given extended metal cut is aligned to the required metal cut. For example, the extended metal cut 510 is aligned in the x-axis the required metal cut 505 for wire 150A.

The fabrication equipment 610 (computer 605) is configured to perform an additional cut (e.g., additional cuts 905 and/or 910 in FIG. 9) on the adjacent metal fills having a length greater than a predefined length, in order to reduce parasitic capacitance affecting the metal wires 150 adjacent to the adjacent metal fills 180.

FIG. 13 is a flow chart 1300 of a method of optimizing SADP according to one or more embodiments. Reference can be made to FIGS. 1-12 discussed herein.

At block 1305, the fabrication equipment 610 (computer 605) is configured to provide predefined locations for required metal cuts 505 in order to form metal wires 150 from metal fills 180 that have been cut.

At block 1310, the fabrication equipment 610 (computer 605) is configured to prioritize the metal wires 150, such that a highest priority to a lowest priority is determined for the metal wires 150 (and placed in a prioritized metal wires list/database 650).

At block 1315, the fabrication equipment 610 (computer 605) is configured to expand the predefined locations for the required metal cuts 505 to have extended locations for extended metal cuts 510 in order to cut adjacent metal fills 180, where the adjacent metal fills 180 are the metal fills that are adjacent to the predefined locations for the required metal cuts 505. The extended metal cuts 510 extend beyond the required metal cuts 505. The metal wires 150 having been prioritized from the highest priority to the lowest priority are associated with the extended locations for the extended metal cuts 510 because the extended locations are expanded from the predefined locations. In one implementation, the prioritized metal wires 150 have a mapping to their respective extended metal cuts 510 in the prioritized metal wires list/database 650. Therefore, the extended metal cuts 510 are prioritized according to the highest priority to the lowest priority for the metal wires 150 the prioritized metal wires list/database 650.

At block 1320, the fabrication equipment 610 (computer 605) is configured to perform a check on the extended locations for the extended metal cuts 510 in an order of the highest priority to the lowest priority of the extended locations for the extended metal cuts 510 associated with the metal wires 150, such that a probability of having to remove the extended locations associated with metal wires 150 having a higher priority is smaller than having to remove the extended locations associated with metal wires 150 having a lower priority.

At block 1325, the fabrication equipment 610 (computer 605) is configured to perform/execute the required metal cuts 505 into the metal fills 180 and the extended metal cuts 510 into the adjacent metal fills 180.

The fabrication equipment 610 (computer 605) is configured to remove the extended locations for the extended metal cuts that violate design rules. The fabrication equipment 610 (computer 605) is configured to, for a given extended location for a given extended metal cut that violates a minimum spacing requirement of the design rules with respect to a given cut, utilize a first mask to make the given extended metal cut and a second mask to make the given cut, thereby avoiding the minimum spacing requirement. The required metal cuts into the metal fills and the extended metal cuts into the adjacent metal fills are both performed simultaneously. The extended metal cuts into the adjacent metal fills reduce parasitic capacitance.

The adjacent metal fills are adjacent to the metal wires having been formed by the required metal cuts at the predefined locations, and a given adjacent metal fill for a given metal wire is not on a same row as the given metal wire. A given predefined location is in a first row, and the given predefined location is for a given required metal cut to form a given metal wire from a given metal fill.

A given extended location is in a second row, and the given extended location being for a given extended metal cut to cut a given adjacent metal fill. The given extended location for the given extended metal cut is aligned to the given predefined location for the given required metal cut, such that the given extended metal cut is aligned to the required metal cut.

The fabrication equipment 610 (computer 605) is configured to perform an additional cut on the adjacent metal fills having a length greater than a predefined length, in order to reduce parasitic capacitance affecting the metal wires adjacent to the adjacent metal fills.

A semiconductor structure (e.g., layout 100) is formed by SADP according to one or more embodiments. The structure includes wire metals 150 formed by cutting metal fills 180 to form required cuts 505. The structure includes adjacent metal fills of the metal fills, and the adjacent metal fills 180 include extended cuts 510, where the extended cuts 510 are aligned to the required cuts 505. The required cuts and the extended cuts are spaces of removed metal from the metal fills 180. The spaces of the extended cuts 510 in the adjacent metal fills and the spaces of the required cuts 505 in the metal fills are aligned in a horizontal direction (e.g., in a direction in the x-axis). The spaces of the extended cuts and the required cuts have (about) an equal length in the x-axis. The adjacent metal fills are the metal fills that are adjacent to the predefined locations for the required metal cuts, and the extended metal cuts 510 extend an offset distance (e.g., a predefined/fixed distance in the y-axis) beyond the required metal cuts 505.

Technical effects and benefits include SADP metal fill optimization methods and structures. Technical benefits further include techniques to cut the metal fills to improve the performance while avoiding design rule check (DRC) errors. Technical benefits include a reduction in parasitic capacitance.

The term "about" and variations thereof are intended to include the degree of error associated with measurement of the particular quantity based upon the equipment available at the time of filing the application. For example, "about" can include a range of ±8% or 5%, or 2% of a given value.

It will be noted that various microelectronic device fabrication methods can be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of optimizing self-aligned double patterning, the method comprising:
   providing predefined locations for required metal cuts in order to form metal wires from metal fills that have been cut, the metal wires having a priority;
   providing extended locations for extended metal cuts in order to cut adjacent metal fills, the adjacent metal fills being the metal fills that are adjacent to the predefined locations for the required metal cuts, wherein the extended metal cuts extend beyond the required metal cuts, wherein the metal wires having a higher priority are associated with a higher likelihood of having the extended metal cuts as compared to the metal wires having a lower priority; and
   performing the required metal cuts into the metal fills and the extended metal cuts into the adjacent metal fills.

2. The method of claim 1, further comprising performing a check to determine if the extended locations for the extended metal cuts violate design rules.

3. The method of claim 2, further comprising removing the extended locations for the extended metal cuts that violate the design rules.

4. The method of claim 2, further comprising for a given extended location for a given extended metal cut that violates a minimum spacing requirement of the design rules with respect to a given cut, utilizing a first mask to make the given extended metal cut and a second mask to make the given cut, thereby avoiding the minimum spacing requirement.

5. The method of claim 1, wherein the required metal cuts into the metal fills and the extended metal cuts into the adjacent metal fills are both performed simultaneously.

6. The method of claim 1, wherein the extended metal cuts into the adjacent metal fills reduce parasitic capacitance.

7. The method of claim 1, wherein the adjacent metal fills are adjacent to the metal wires having been formed by the required metal cuts at the predefined locations.

8. The method of claim 7, wherein a given adjacent metal fill for a given metal wire is not on a same row as the given metal wire.

9. The method of claim 1, wherein a given predefined location is in a first row, the given predefined location being for a given required metal cut to form a given metal wire from a given metal fill.

10. The method of claim 9, wherein a given extended location is in a second row, the given extended location being for a given extended metal cut to cut a given adjacent metal fill.

11. The method of claim 10, wherein the given extended location for the given extended metal cut is aligned to the given predefined location for the given required metal cut, such that the given extended metal cut is aligned to the given required metal cut.

12. The method of claim 1, further comprising performing an additional cut on the adjacent metal fills having a length greater than a predefined length, in order to reduce parasitic capacitance affecting the metal wires adjacent to the adjacent metal fills.

13. A structure formed by self-aligned double patterning, the structure comprising:
  wire metals formed by cutting metal fills to form required metal cuts, the metal wires having a priority; and
  adjacent metal fills of the metal fills, the adjacent metal fills including extended cuts, wherein the extended cuts are aligned to the required metal cuts, wherein the required metal cuts and the extended cuts are spaces of removed metal from the metal fills, wherein the metal wires having a higher priority are associated with a higher likelihood of having the extended metal cuts as compared to the metal wires having a lower priority.

14. The structure of claim 13, wherein the spaces of the extended cuts in the adjacent metal fills and the spaces of the required metal cuts in the metal fills are aligned in a horizontal direction.

15. The structure of claim 14, wherein the spaces of the extended cuts and the required metal cuts have an equal length.

16. The structure of claim 14, wherein the adjacent metal fills are the metal fills that are adjacent to predefined locations for the required metal cuts, wherein the extended cuts extend an offset distance beyond the required metal cuts.

17. The structure of claim 14, wherein the wire metal includes copper.

18. The structure of claim 14, wherein the wire metal includes aluminum.

19. The structure of claim 14, wherein the wire metal includes gold.

20. A computer program product of a design for optimizing self-aligned double patterning, the computer program product comprising a computer readable storage medium having program instructions embodied therewith, wherein the computer readable storage medium is not a transitory signal per se, the program instructions readable by a computer to cause the computer to perform a method comprising:
  providing predefined locations for required metal cuts in order to form metal wires from metal fills that have been cut, the metal wires having a priority;
  providing extended locations for extended metal cuts in order to cut adjacent metal fills, the adjacent metal fills being the metal fills that are adjacent to the predefined locations for the required metal cuts, wherein the extended metal cuts extend beyond the required metal cuts, wherein the metal wires having a higher priority are associated with a higher likelihood of having the extended metal cuts as compared to the metal wires having a lower priority; and
  causing fabrication equipment to perform the required metal cuts into the metal fills and the extended metal cuts into the adjacent metal fills.

* * * * *